(12) United States Patent
Bernklau

(10) Patent No.: US 8,692,540 B2
(45) Date of Patent: Apr. 8, 2014

(54) SPLIT CORE STATUS INDICATOR

(75) Inventor: James Bernklau, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 1083 days.

(21) Appl. No.: 12/228,482

(22) Filed: Aug. 13, 2008

(65) Prior Publication Data

US 2009/0115403 A1    May 7, 2009

Related U.S. Application Data

(60) Provisional application No. 60/993,330, filed on Sep. 10, 2007.

(51) Int. Cl.
*G01R 15/18*    (2006.01)

(52) U.S. Cl.
USPC .... 324/127; 324/126; 324/117 H; 324/117 R; 336/90; 336/92; 336/176; 336/208; 336/212; 361/620; 361/623; 361/836

(58) Field of Classification Search
USPC .......... 324/126, 127, 117 H, 117 R; 336/176, 336/92, 208, 212; 361/620, 623, 836
See application file for complete search history.

(56) References Cited

U.S. PATENT DOCUMENTS

| | | | |
|---|---|---|---|
| 1,100,171 A | 6/1914 | Brown | |
| 1,455,263 A | 5/1923 | Oberfell | |
| 1,569,723 A | 1/1926 | Dickinson | |
| 1,800,474 A | 4/1931 | Scherer | |
| 1,830,541 A | 11/1931 | Harris | |
| 1,871,710 A | 8/1932 | Lenehan | |
| 2,059,594 A | 11/1936 | Massa, Jr. | |
| 2,411,405 A | 11/1946 | Yuhas | |
| 2,412,782 A | 12/1946 | Palmer | |
| 2,428,613 A | 10/1947 | Boyajian | |
| 2,428,784 A | 10/1947 | Cole | |
| 2,512,070 A | 6/1950 | Nelsen et al. | |
| 2,663,190 A | 12/1953 | Ilgenfritz | |
| 2,746,295 A | 5/1956 | Lubkin | |
| 2,802,182 A | 8/1957 | Godshalk et al. | |
| 2,852,739 A | 9/1958 | Hansen | |
| 2,943,488 A | 7/1960 | Strobel et al. | |
| 3,190,122 A | 6/1965 | Edwards | |
| 3,243,674 A | 3/1966 | Ebert | |

(Continued)

FOREIGN PATENT DOCUMENTS

| | | |
|---|---|---|
| EP | 1531334 A2 | 5/2005 |
| JP | 5083776 | 4/1993 |

OTHER PUBLICATIONS

Description of KT® 6300, 6400 Split-Core kW/kWH Transducers . . . Enercept KT®, 1 page by Hawkeye® (by Veris Industries, Inc.), at least one year prior to filed (1997) (unavailable month).

(Continued)

*Primary Examiner* — Tung X Nguyen
*Assistant Examiner* — Thang Le
(74) *Attorney, Agent, or Firm* — Chernoff, Vilhauer, McClung & Stenzel, LLP

(57) ABSTRACT

The size of a status indicator for monitoring a current in a power cable is reduced by integrating a bobbin for the secondary winding with a current transformer core and integrating a circuit board including output terminals with a current transformer assembly.

11 Claims, 5 Drawing Sheets

(56) References Cited

U.S. PATENT DOCUMENTS

| | | |
|---|---|---|
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Sanger et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 3,976,924 A | 8/1976 | Vanjani |
| 4,001,647 A | 1/1977 | Klein et al. |
| 4,001,758 A | 1/1977 | Esper et al. |
| 4,007,401 A | 2/1977 | Kimmel |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,124,030 A | 11/1978 | Roberts |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A * | 3/1981 | Belfer et al. .................. 336/73 |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,962 A | 7/1988 | Fernandes |
| 4,783,748 A | 11/1988 | Swartzrauber et al. |
| 4,794,327 A | 12/1988 | Fernandes |
| 4,808,910 A | 2/1989 | Kessi |
| D301,331 S | 5/1989 | Rhodin |
| 4,851,803 A * | 7/1989 | Hahn .................. 336/176 |
| 4,855,671 A | 8/1989 | Fernandes |
| 4,874,904 A | 10/1989 | DeSanti |
| 4,885,655 A | 12/1989 | Springer et al. |
| 4,887,018 A | 12/1989 | Libert |
| 4,890,318 A | 12/1989 | Crane et al. |
| 4,926,105 A | 5/1990 | Mischenko et al. |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,991,050 A | 2/1991 | Heberlein, Jr. et al. |
| 4,992,709 A | 2/1991 | Griffin |
| 4,999,575 A | 3/1991 | Germer |
| 5,003,278 A | 3/1991 | May |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah et al. |
| 5,359,273 A | 10/1994 | Fluckiger |
| D354,945 S | 1/1995 | Dellavecchia et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,502,374 A | 3/1996 | Cota |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr et al. |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,995,911 A | 11/1999 | Hart |
| 6,005,760 A | 12/1999 | Holce et al. |
| 6,018,239 A * | 1/2000 | Berkcan et al. .................. 324/127 |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A | 5/2000 | Redmyer |
| 6,091,023 A | 7/2000 | O'Donnell |
| 6,118,077 A * | 9/2000 | Takeuchi .................. 174/92 |

(56) References Cited

U.S. PATENT DOCUMENTS

| | | |
|---|---|---|
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,219,216 B1 | 4/2001 | Holce et al. |
| 6,236,949 B1 | 5/2001 | Hart |
| 6,269,317 B1 | 7/2001 | Schachner et al. |
| 6,308,140 B1 | 10/2001 | Dowling et al. |
| 6,330,516 B1 | 12/2001 | Kammeter |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | O'Donnell |
| D466,078 S | 11/2002 | Bowman |
| 6,496,378 B2 | 12/2002 | Holce et al. |
| 6,504,357 B1 | 1/2003 | Hemminger et al. |
| 6,504,695 B1 | 1/2003 | Holce et al. |
| 6,507,261 B1 * | 1/2003 | Haga et al. .................. 336/198 |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,724,600 B2 | 4/2004 | Holce et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 | 10/2004 | Bruno et al. |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,937,003 B2 | 8/2005 | Bowman et al. |
| 6,950,292 B2 * | 9/2005 | Holce et al. .................. 361/94 |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,310,049 B2 | 12/2007 | Bowman |
| 7,312,686 B2 | 12/2007 | Bruno |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,969,271 B2 * | 6/2011 | Lai et al. .................. 336/192 |
| 2004/0227503 A1 | 11/2004 | Bowman et al. |
| 2005/0127895 A1* | 6/2005 | Rittmann .................. 324/117 R |
| 2005/0240362 A1 | 10/2005 | Randall |
| 2006/0085144 A1 | 4/2006 | Slota et al. |
| 2006/0164096 A1 | 7/2006 | Kwon |
| 2007/0205750 A1* | 9/2007 | Yakymyshyn et al. ........ 324/127 |

OTHER PUBLICATIONS

Ganssie, "Interrupt Latency," Embedded.com, www.ernbedded.com/show Article . . . jhmtl?articleID= 9900320, Aug. 26, 2004.

AT91M42800A Summary, "AT91 ARM Thumb Microcontrollers," Atmel, Feb. 2002.

* cited by examiner

SPLIT CORE STATUS INDICATOR

CROSS-REFERENCE TO RELATED APPLICATIONS

This application claims the benefit of U.S. Provisional App. No. 60/993,330, filed Sep. 10, 2007.

BACKGROUND OF THE INVENTION

The present invention relates to a device for indicating the operating state of an electrical load and, more particularly, to a device for monitoring electric current in a cable connecting a load and a power source.

Many industrial, commercial and residential environments incorporate large numbers of electrical loads that are widely distributed geographically and often located in sites where access is difficult. Many these devices are small and draw very limited amounts of current, often only a small fraction of an amp. However, the operation of these loads, for example, small fan motors or lights can be important to maintaining a safe environment or the successful completion of a process that may involve costly or hazardous equipment or materials. Although desirable, monitoring the operation of these devices is complicated by their remoteness from the monitoring location. In addition, these devices are often controlled by a controller that is equally remote from the monitoring location. For example, while security or maintenance personnel may desire to monitor the operation of a building's lights from a central location, the lights of a commercial building are commonly controlled by switches, photo-detectors, or motion sensors located on the floor or in the room where the light is located. Likewise, an operator of an industrial process may desire to monitor the operation of a number of widely distributed devices, for example, the operation of a heater and a fan located in an air duct and controlled by a remotely located thermostatic sensor.

The state of the switch controlling the operation of a load can sometimes be signaled to a remotely located monitoring station, but the additional wiring and circuit complexity often makes monitoring the state of the switch impractical. For example, a second set of contacts in the switch that controls the load could be used to activate a relay signaling an open or closed connection between a power source and a load. However, the cost a switch with a second set of contacts, a relay, and wiring to connect the relay to a remote monitoring location is often prohibitively expensive.

Remote signaling of the operating status of an electrical device is commonly provided by a status indicator comprising a current sensor that is electromagnetically coupled to a cable supplying power to the monitored electrical device or load. Baron et al., U.S. Pat. No. 7,193,428, incorporated herein by reference, disclose a status indicator comprising a current sensor and a low threshold current switch. The status indicator includes a current transformer comprising an annular transformer core that encircles the power cable. Fluctuating current in the power cable produces a changing electromagnetic field around the cable which, in turn, induces a magnetic flux in the core of the current transformer. The magnetic flux in the core induces a voltage in a wire winding that encircles the cross-section of the core. Thus, the power cable is the primary winding and the wire winding is the secondary winding of the current transformer. The secondary winding is connected a rectifier and a capacitor that is selected to cause the circuit to resonate at the expected frequency of the alternating current induced in the secondary winding, typically 50-60 Hz. The output of the resonant circuit, comprising the secondary winding and the resonating capacitor, is the input to a voltage multiplier. When a current is present in the power cable, a voltage is induced in the secondary winding which is multiplied in the voltage multiplier causing a pair of transistors of a current switch to conduct shorting the output terminals of the status indicator. When there is no current in the power cable, a voltage is not induced in the secondary winding and the switch transistors do not conduct, preventing conduction between the switch output terminals. The low threshold current switch is capable of detecting currents less than 0.15 amps making the status indicator particularly useful for loads that draw very limited currents.

The low threshold current switch can be implemented with either a solid core current transformer, as illustrated in U.S. Pat. No. 7,193,428 or a split core current transformer. Passing the power cable through the central aperture of a solid core transformer requires that the power cable be disconnected so that the end of the cable can be inserted into the aperture. This can be particularly difficult when a status indicator is to be retrofitted to an existing circuit and the most desirable location of the device is between distantly located termini of the power cable. Cota, U.S. Pat. No. 5,502,374, incorporated herein by reference, discloses a split core current transformer that enables engagement of a power cable without disconnecting the cable. The hinged case enables the halves of the toroidal core to pivoted apart. The cable can pass between the open ends of the core portions and then be secured in the central aperture of the core by pivoting the portions of the core back together. While a split core sensing transformer facilitates installation, particularly where it is difficult to pass a disconnected end of the cable through the core's aperture, the current transformer is quite large making it difficult to locate the device in the small electrical enclosures and spaces that often typify installations incorporating loads having limited current draws.

What is desired, therefore, is a very compact device for detecting and indicating the status of current flowing in an electrical conductor.

DETAILED DESCRIPTION OF PREFERRED EMBODIMENTS

Figure 1:
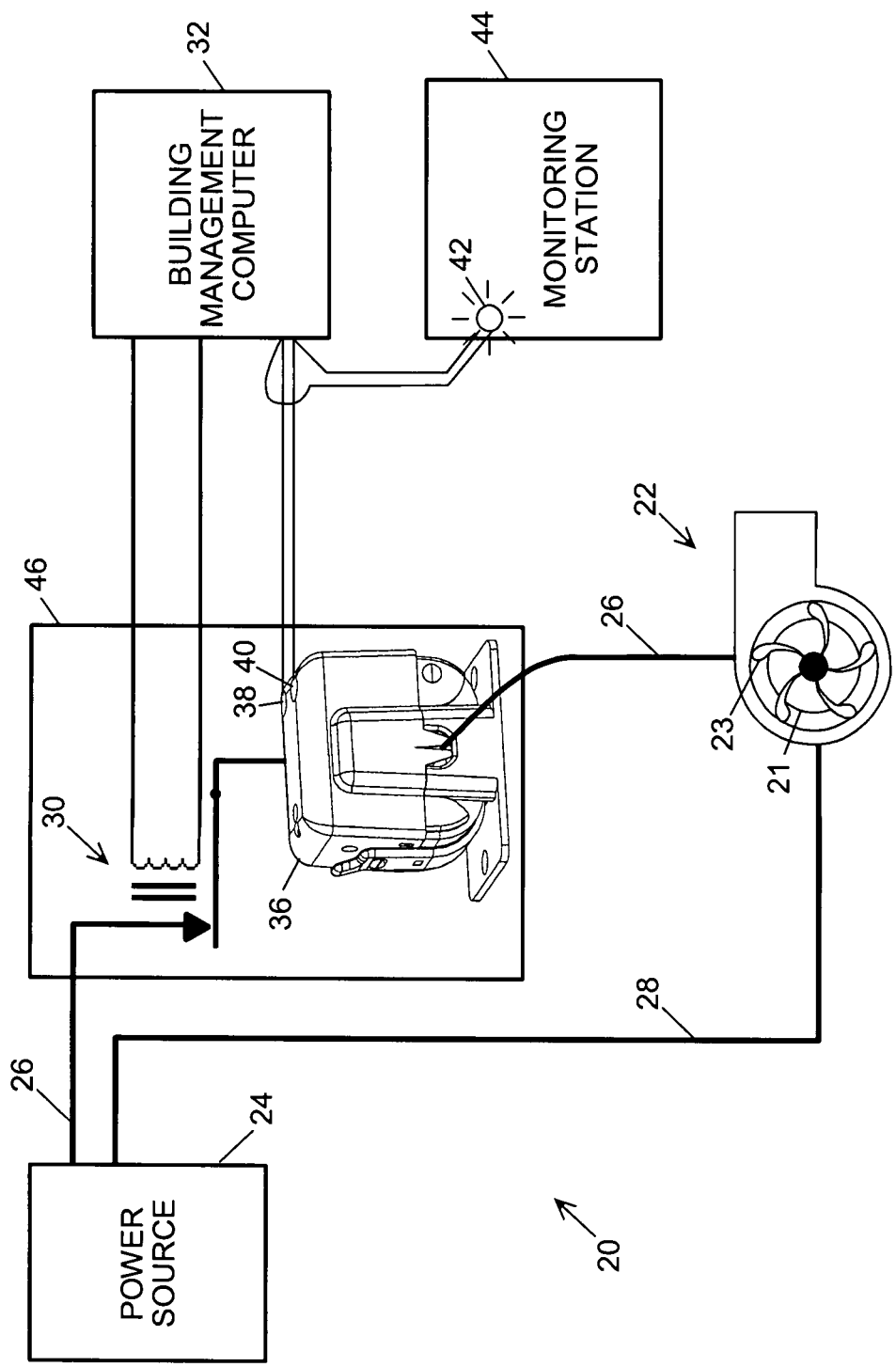
FIG. 1 is a schematic illustration of an electrical circuit including a remotely controlled and monitored load.

Referring in detail to the drawings where similar parts are identified by like reference numerals and referring more particularly to FIG. 1, an exemplary electrical system 20 includes an electrical load 22 that is connected to a power supply 24 by power cables 26, 28. By way of examples, loads may include valves, heaters, relays, lights, and motors that drive pumps, fans, etc. In the exemplary system, the load comprises a motor 21 that drives a fan 23. The operation of the motor of the exemplary system is controlled by a relay 30 which, in turn, is controlled by a building management controller 32. A status indicator 36 comprising generally a current transformer to sense current in a power cable and a current switch that is actuated by the output of the current transformer, monitors the current flow in one of the power cables. When the fan motor 22 is running and current is flowing to the fan motor in the power cable 26, the status indicator provides a first signal at the output terminals 38, 40 which are conductively connected to the building management computer and/or an annunciator 42 at a monitoring station 44 which may be remote from the building management computer and the elements of the monitored electrical circuit. When current flow ceases in the power cable 26, the status indicator provides a second signal at the terminals for the remote controller or the monitoring station indicating that the fan motor is no longer operating.

For ease of installation it is often desirable to install the status indicator in an electrical enclosure that houses another element of the circuit being monitored. For example, the status indicator 36 for the exemplary electrical circuit is located in the same enclosure 46 as the relay that controls power to the fan motor. On the other hand, it may be desirable to co-locate the current switch in an enclosure with the wiring connections to the motor or at some other intermediate point. Small enclosures are commonly utilized in association with loads that draw lower currents and even if the status indicator is located separately, it is desirable that its size be minimized to facilitate installation in walls, duct work or other close environments. Moreover, to facilitate installation, particularly when retrofitting an existing circuit, it is highly desirable that the status indicator include a split core current transformer. The size and cost of a wire wound, split, toroidal core current transformer is a substantial impediment to reducing the size of a current sensing status indicator.

The secondary windings of toroidal current transformers are typically wound directly on the toroidal core which may be coated or boxed with a dielectric to insulate the core from the conductor comprising the winding. On the other hand, the secondary windings or coil of so-called bobbin wound transformers are typically wound on a rigid, insulating, preformed bobbin that includes an aperture enabling the bobbin and the coil to be slipped over a portion of the transformer core. The bobbin maintains the coil's shape and size while the coil is assembled on the transformer core and insulates the winding from the core when the transformer is assembled. However, a bobbin wound coil is typically not used for current transformers, even if the core comprises separable segments, because the core is typically annular or an annulated rectangle, that is, a generally rectangular or square ring with a central aperture to receive the power cable. An enlarged bobbin and coil would be required to provide sufficient clearance to slide the bobbin over the curve or around the orthogonal corners of the core segment. The present inventor concluded that the size and cost of a current monitoring status indicator could be substantially reduced if the coil could be wound on a bobbin that was integral with a portion of the current transformer core.

Figure 2:
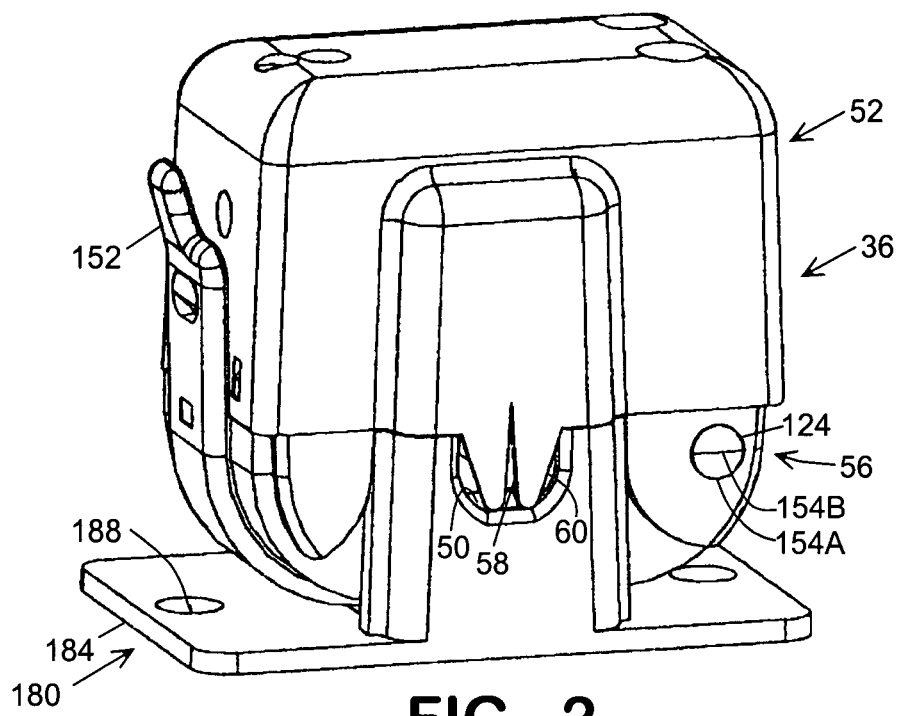
FIG. 2 is a perspective drawing of a status indicator.
Figure 3:
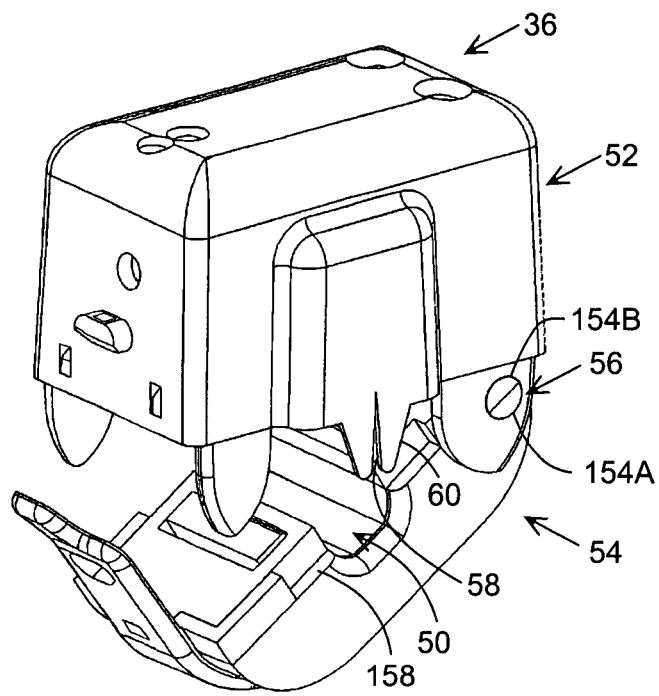
FIG. 3 is a perspective drawing of the status indicator of FIG. 2. in an open condition to permit a cable to be situated in the area of the center aperture.

Referring to FIGS. 2 and 3, the body of the status indicator 36 is, generally, an annular rectangular block with rounded corners and a center aperture 50 through which a power cable can be passed. The status indicator comprises upper 52 and lower 54 portions that are connected by a hinge 56 enabling relative rotation of the upper and lower portions. By swinging the upper portion away from the lower portion, a gap is created between the portions, distal of the hinge, enabling a power cable to be situated in the area of the center aperture without the necessity of disconnecting the cable. Once the cable is in place, the portions of the status indicator are rotated together, conjoining the portions and encircling the power cable within the center aperture. The position of the power cable in the center aperture is restrained in a groove 58 in the end of a resilient finger 60 that projects from the upper portion of the status indicator into the vicinity of the center aperture.

Figure 4:
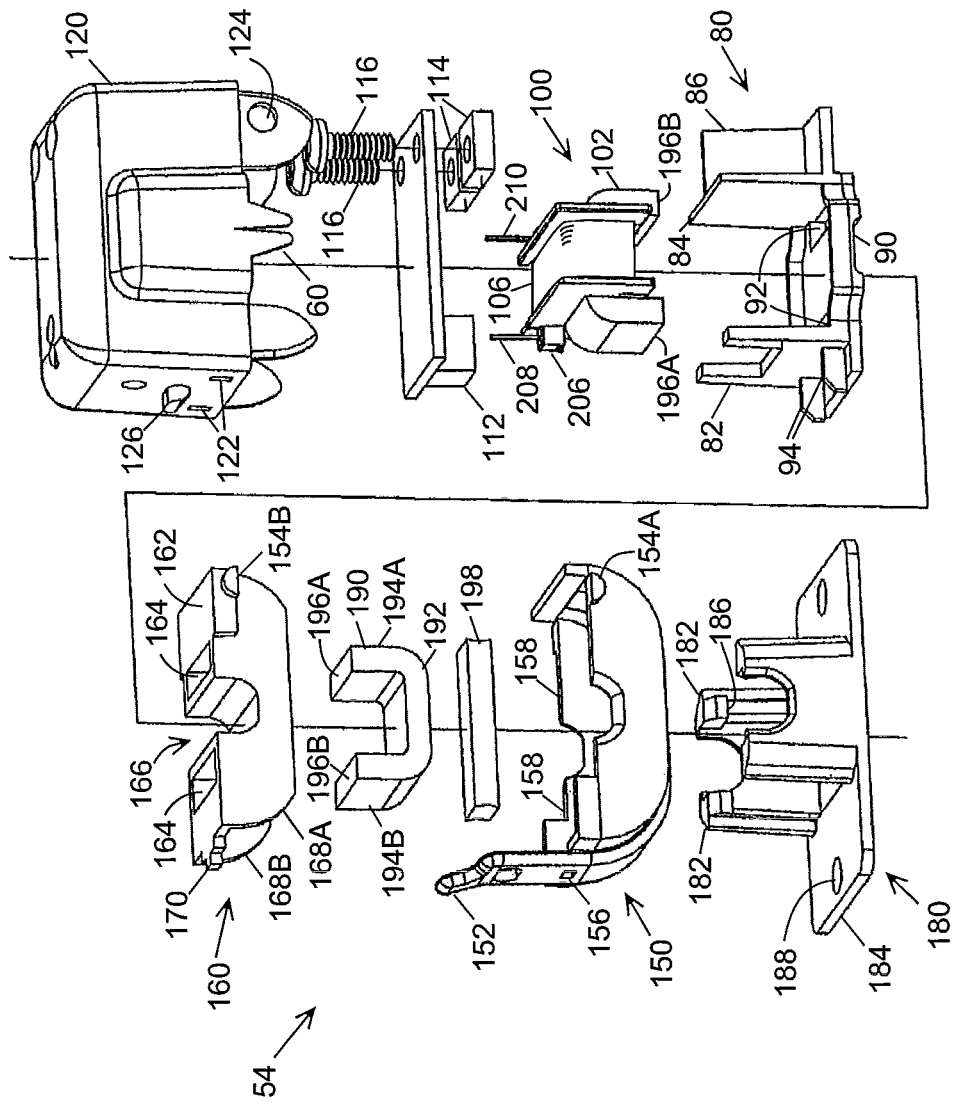
FIG. 4 is an exploded view of the status indicator of FIG. 2.

Referring also to FIG. 4, the upper portion of the status indicator comprises a frame 80 and an upper housing 120. The frame comprises front 82 and back 84 walls and a spine 86 that project normal to a bottom plate 88. The bottom plate is generally planar with a central depression 90 and includes a pair of apertures 92 adjacent, respectively, to the front and back walls. A circuit board 110 and a transformer core assembly 100 are securable to the frame. The upper housing 120 slides over and encloses the assembly comprising the frame, circuit board and transformer core assembly and is secured by interactions between a plurality of projections 94 extending from the frame and corresponding apertures 122 in the upper housing. A portion on each side of the upper housing defines a hinge aperture 124 to receive, respectively, a hinge pin projecting from the lower portion.

The lower portion 54 of the status indicator 36 comprises a lower housing 150 and a cover 160. The lower housing is generally C-shaped in the elevation view with a cantilevered latch arm 152 projecting from one end. At the opposite end of the lower housing, a semi-circular lower portion of a hinge pin 154A protrudes from each side of the housing. The depressed center of the C-shaped housing defines a portion of the center aperture 50 of the status indicator. The cover 160 comprises a top plate 162 defining a pair of apertures 164 and having a depressed central groove portion 166 that aligns with the depressed center of the lower housing. A wall 168A, 168B projects normal to the top plate at either side of the cover. A semicircular hinge pin segment 154B projects laterally from either side of the cover. The lower housing and cover are assembled by sliding the walls of the cover between the walls of the lower housing. One end of the cover is securable in the lower housing by engagement of a projection 170 extending from the end of the cover into a corresponding aperture 156 in the wall of the lower housing.

The upper and lower housings, the cover and the frame preferably comprise a resilient, insulating material, such as acrylonitrile butadiene styrene (ABS) plastic. To assemble the upper and lower portions of the status indicator, the portions of the lower housing and the cover defining the hinge pins are aligned with the portions of the upper housing defining the hinge apertures. The portions of the status indicator are pressed together deforming the resilient material. When the hinge pins reach alignment with the hinge apertures in the upper housing, the resilient housings return to their undeformed shapes capturing the hinge pins within their respective corresponding apertures. The second end of the cover is secured to the lower housing by the simultaneous confinement of the hinge pin halves 154A, 154B of the lower housing and the cover in the hinge apertures 124.

The latch arm 152 projecting upward from the side of the lower housing includes a portion defining a latching aperture 156. When the hinged upper and lower portions of the status indicator are swung together to conjoin the sides distal of the hinge, the latch arm engages a stud 126 projecting from the surface of the upper housing causing the cantilevered arm to deflect. When the stud and the latching aperture reach alignment, the resilient latch arm recovers and the mating surfaces of the stud and aperture lock the upper and lower housings in the closed position.

The status indicator preferably also includes a removable mounting base 180 providing one or more features for securing the device in an environment, for example securing the indicator to a surface, such as the wall of an enclosure, or engaging a mating mounting mechanism, such as a mounting rail. The mounting base preferably comprises a plurality of projecting arms 182 affixed to a mounting structure, for example a substantially planar mounting plate 184, and arranged to slide over the surface of the housing. Preferably, each of the arms includes a latching surface 186 that is arranged to engage a corresponding engagement surface 158 on the lower housing. To install the status indicator, the mounting base is secured to a surface or a mounting rail, for example with screws projecting through screw apertures 188 in the mounting plate. The lower housing of the status indicator is nested between the projecting arms of the mounting base and the body of the status indicator is pushed toward the mounting plate. When the latching surfaces of the arms are aligned with the respective engagement surfaces on the lower housing, the resilient arms rebound and mutual engagement of the surfaces secures the housing to the mounting base. The slidably engageable mounting base reduces the size of the status indicator and facilitates its installation by enabling unobstructed access to the mounting screws or other mounting or securing devices during installation of the mounting base while providing a mounting that is not substantially larger than the footprint of the status indicator housing.

Figure 5:
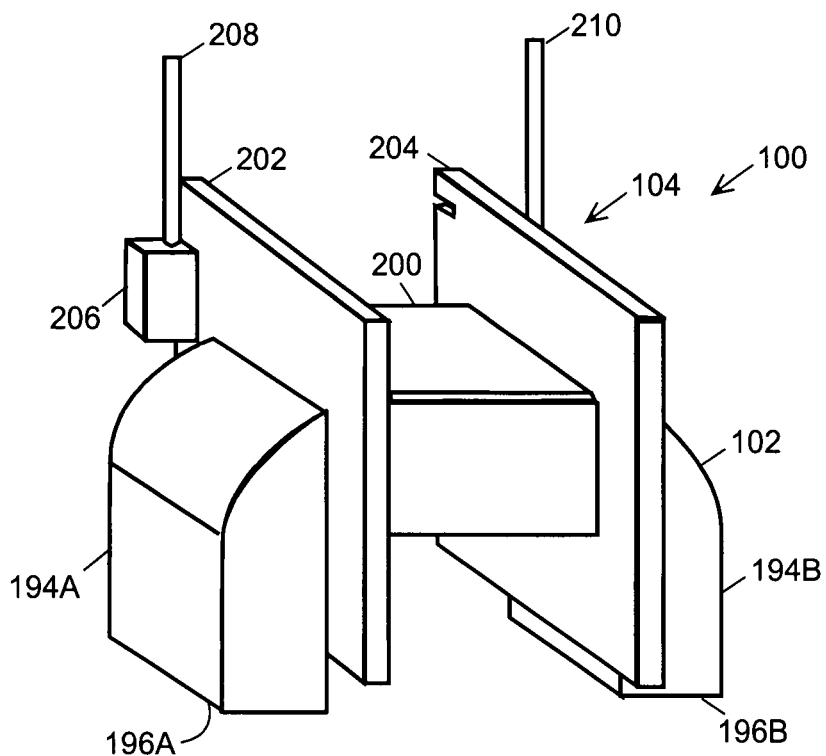
FIG. 5 is a perspective view of a transformer core segment and integral bobbin.

The current transformer of the status indicator comprises the upper transformer assembly 100 and a lower transformer core segment 190. Referring also to FIG. 5, the upper transformer assembly includes an upper transformer core segment 102 with an integral bobbin 104 and a coil 106 comprising an electrical conductor and insulation that is wound around a center portion 200 of the bobbin. The upper and lower transformer core segments comprise a magnetically permeable material, for example a strip of grain oriented, 0.012 silectron, 3% silicon steel. The magnetically permeable material is typically formed into a ring that is generally rectangular in shape with rounded corners. The ring is cut in half to form two C- or U-shaped core segments, each comprising a base portion 192 with a leg 194A, 194B projecting substantially normal to the base at each end of the base. When the end portions 196A, 196B of the legs 194A, 194B of the two core segments are joined together, the combined core segments form the annular, rectangular core of the current transformer. An alternating current in a power cable located in the central aperture of the magnetically permeable transformer core produces an expanding and collapsing magnetic field around the cable that induces a varying magnetic flux in the magnetically permeable transformer core. The varying magnetic flux in the core, in turn, induces an electric current in a conductor that is wound around a cross-section of the ring-like core.

An annular rectangular core can be very efficient enabling a physically small transformer core to induce a measurable current in the secondary winding at low levels of power cable current. However, the secondary winding or coil is typically wound directly on the base of a C-shaped transformer segment increasing the difficulty and the cost of manufacturing the transformer. The cost of a transformer can be reduced if the coil can be wound on a bobbin which is slipped over the core after winding. The bobbin preserves the shape of the coil during assembly and can insulate the conductor in the winding from the core. However, the perpendicularly projecting legs of a C-shaped transformer core segment make slipping a bobbin wound core over the base of the core segment impractical as a very large hole, and consequently a very large coil, is required to enable a bobbin to pass over the right angle corner at the junction of the core's base and leg. While a bobbin wound coil can be slipped over a leg of a U-shaped transformer core, the length of the leg or the diameter of the coil must be increased significantly, increasing the size of the transformer. The current inventor concluded, however, the advantages of a bobbin wound core could be obtained with a bobbin that is integral with the core segment and includes a portion that encircles the cross-section of the base of the C-shaped core.

The upper transformer core assembly 100 comprises a C-shaped core segment 102 with a bobbin 104 that is affixed to the base portion of the core segment. Preferably, the bobbin is molded in place on the transformer core segment. The bobbin comprises an electrically insulating material and includes a tube portion 200 that encircles the substantially rectangular cross-section of the base of the transformer core segment and flanges 202, 204 that are spaced apart on the tube portion and which project normal to the tube. The flanges confine the conductor and insulating material when they are wound around the tube portion to form the coil and provide structures 206 for anchoring the ends of the winding conductor and conductively connecting the conductor to conductive posts 208, 210 that project upward from the flange.

Figure 6:
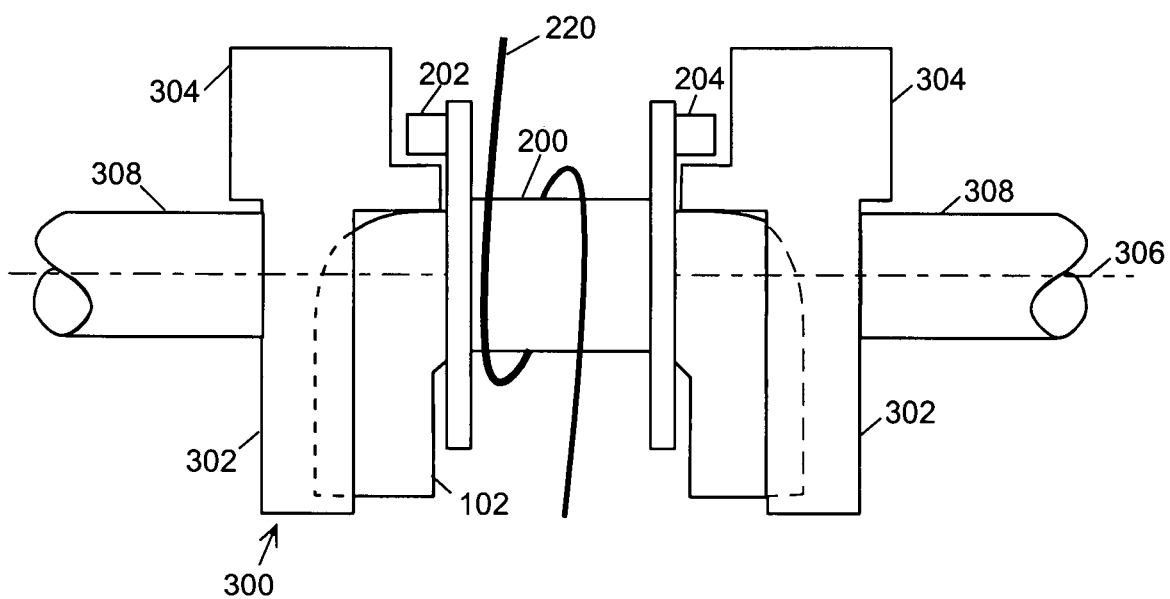
FIG. 6 is a side view of a transformer core segment with integral bobbin in a winding fixture.

Referring to FIG. 6, an offset winding fixture enables the conductor 220 of the secondary winding to be wound around the tube portion 200 of the integral bobbin 104. The transformer core segment 102 with integral bobbin in place is secured in the fixture 300. The fixture 300 comprises, generally, a pair of engagement plates 304 that include relieved surfaces in their faces to receive the legs of the C-shaped transformer core segment and a surface to engage the base of the segment securing the core segment for rotation. The engagement plates are constructed with weights 304 that counter-balance the off-center weight distribution of the C-shaped core when it is rotated about the central axis 306 of the base on shafts 308.

The inventor also concluded that the size of the status indicator could be further reduced by integrating a portion of the transformer core and the current switch, including its output terminals, in an assembly. In the status indicator 36, the upper transformer core assembly including the upper transformer core segment, integral bobbin and coil is supported in the frame 80 by the flanges of the integral bobbin with the ends of the legs of the C-shaped core projecting into respective corresponding apertures 92 in the frame. The outwardly projecting conductive posts 208, 210 that are interconnected to the respective ends of the coil conductor are inserted into apertures in a circuit board assembly 100 and interconnected with conductors on the circuit board. The circuit board assembly includes a current switch 112 and a pair screw terminals that enable connection of wires leading to a remote annunciator or control device. The screw terminals each comprise a nut 114 that is prevented from rotating by interference with the spine 86 on the frame and a screw 116. Preferably, the threads of the screw are deformed to prevent the disengagement of the screw and the nut when connecting a wire to the terminal.

Figure 7:
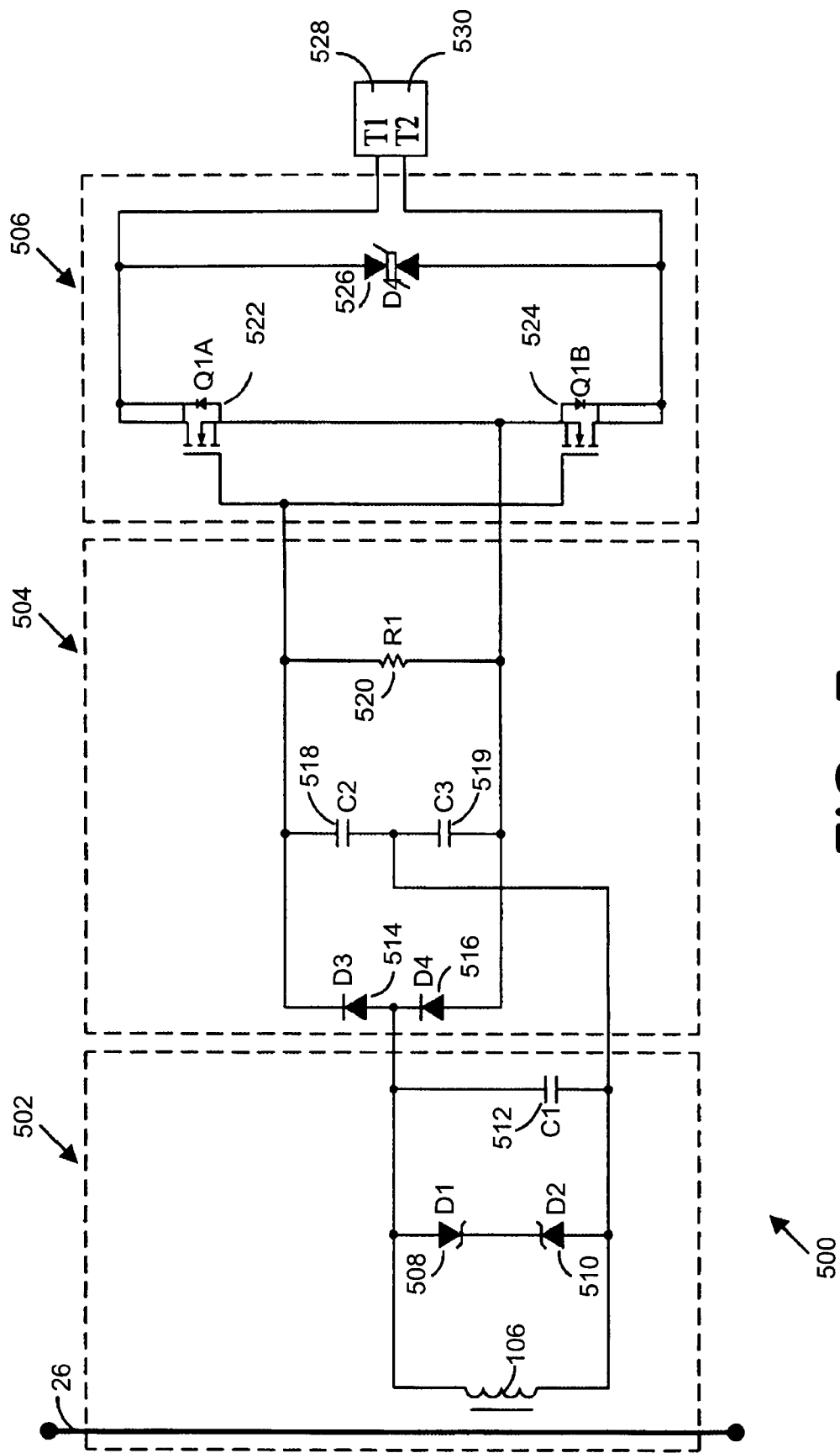
FIG. 7 is a schematic diagram of a low threshold current switch.

Although other current switches could be used with the split core transformer, Baron et al., U.S. Pat. No. 7,193,428, incorporated herein by reference, disclose a current switch that is particularly suitable for monitoring power cable currents between approximately 0.15 amps and 200 amps. Referring to FIG. 7, the current switch 500 comprises a resonant input section 502, a voltage multiplier 504 and a switch 506. A diode clamp, comprising a pair of zener diodes 508, 510 connected in series with opposing forward biases and collectively connected in parallel with the secondary winding 106, and a resonating capacitor 512 provide signal conditioning for the output of the secondary winding. The capacitor 512 is connected in parallel with the secondary winding and is selected to resonate at the expected frequency of the alternating current in the monitored power cable, 50-60 Hz in the U.S. The resonant circuit, comprising the resonating capacitor and the secondary winding, increases the amplitude of the voltage signal at frequencies adjacent to the resonant frequency and interferes with signals having frequencies remote to the resonant frequency providing a more distinct, higher voltage signal than that available at the output of the secondary winding and lowering the current threshold required to obtain an output signal from the current transformer. Resonance can be optimized at a low current threshold because the inductive reactance of the secondary winding varies with power level while the capacitor produces little effect at higher power levels. The capacitor 512 also smoothes the secondary winding voltage by charging during the portion of the electrical cycle where the voltage is increasing and discharging during the portion of the cycle when the voltage is decreasing, reducing the difference between the maximum and minimum voltages of the periodic voltage waveform.

The diode clamp controls voltage excursions in the secondary winding to protect the switch 506 from over-voltage and increase its operating range. The Zener diodes of the diode clamp limit the voltage in the secondary winding resulting from inrush current at start up or when operating at higher power cable currents, to protect the field effect transistors (FETs) of the switch 506. The Zener diodes provide a convenient clamping circuit and the low reverse voltage leakage of the diodes enables a lower switching threshold for the current switch, but other clamping circuits could be used to control the sensing transformer output.

The voltage signal output by the sensing transformer 502 is input to a voltage multiplier 504. The voltage multiplier effectively comprises two half-wave rectifiers in series, each rectifier comprising a diode and a capacitor in series with the secondary winding of the current transformer. During the positive half-cycle diode 514 conducts and charges the capacitor 518 and during the negative half-cycle the second diode 516 conducts to charge the second capacitor 519. While additional stages might be incorporated in the voltage multiplier to further amplify the voltage signal, the amplified voltage signal at the output of the single stage voltage multiplier 504 is equal to twice the voltage at the input to the voltage multiplier. To further reduce the threshold of the current switch, diodes exhibiting minimal forward voltage drop, such as Schottky type diodes, are preferable for the voltage multiplier. A resistor 520, in parallel with the capacitors of the voltage multiplier, functions as a fixed load to controllably discharge the capacitors 518, 519 in a predetermined period.

When current is flowing in the power cable 26, the current transformer generates a voltage signal that is multiplied and rectified by the voltage multiplier. The amplified voltage at the output of the voltage multiplier is conducted to the gates and sources of the switch transistors 522, 524 to enable conduction between the respective sources and drains of the transistors. The output terminals of the current switch, T1 528 and T2 530, conductively connected, respectively, to the drains of the switch transistors, are shorted producing a first signal to a controller or other device conductively connected to the terminals. Testing has demonstrated that the low threshold current switch utilized in conjunction with a split core sensing transformer can be used to detect power cable currents less than 0.10 amps. If there is no current flowing in the power cable 26, no voltage is induced in the secondary winding 106 of the current transformer and conduction between the sources and drains of the switch transistors 522, 524 is blocked presenting a second signal, an open circuit, to the attached controller or monitoring device.

The lower transformer core segment 190 is supported in the lower housing 150 by a resilient member 198 with the ends 196A, 196B of the legs 194A, 194B projecting up through respective apertures 164 in the cover 160. When the upper 52 and lower 54 portions of the status indicator are rotated to the closed position, the ends of the upper 102 and lower 190 transformer core segments are conjoined completing the formation of the annular rectangular transformer core. The performance of a split core transformer can be seriously degraded by a gap between the ends of the legs of the core. The resilient member 198 urges the ends of the legs of the lower transformer core into contact with the ends of the legs of the upper transformer core to minimize the gap between the segments and maximize the performance of the core.

The size of the status indicator for monitoring the current in a power cable is reduced by the integration a circuit board and terminals with a segment of the current transformer having a coil wound on a bobbin that is integral with the base of the C-shaped core segment.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I (we) claim:

1. A current transformer comprising:
    (a) a first magnetically permeable core portion consisting of an elongate base having a cross-section, a first leg projecting substantially normal to said base proximate a first end of said base and terminating at a first leg end distal of said base and a second leg projecting substantially normal to said base proximate a second end of said base and terminating at a second leg end distal of said base and spaced apart from said first leg end;
    (b) a bobbin affixed to said base of said first core portion and including a portion substantially encircling said cross-section of said base;
    (c) a winding conductor including a portion wound on said bobbin and encircling said cross-section of said base; and
    (d) a second magnetically permeable core portion including a hinged connection with said first core portion enabling relative rotation of said first core portion and said second core portion about said hinged connection, relative rotation of said first core portion and said second core portion enabling conjoining of said first leg and said second leg and said second core portion, said first and said second core portions defining an aperture when said first leg and said second leg are proximate said second core portion, and relative rotation of said first core portion and said second core portion about said hinged connection enabling separation of said second leg and said second core portion.

2. The current transformer of claim 1 wherein said bobbin comprises:
    (a) a tube having a first tube end and a second tube end, said tube substantially encircling said cross-section of said base of said first core portion;
    (b) a first flange extending outward from said tube proximate said first tube end; and
    (c) a second flange extending outward from said tube and spaced apart from said first flange, said winding conductor encircling said tube within a space between said first and said second flanges.

3. The current transformer of claim 1 further comprising a spring member elastically urging contact between said second core portion and at least one of said first leg and said second leg of said first core portion.

4. A device for monitoring current in a power cable, said device comprising:
    (a) a first magnetically permeable transformer core portion consisting of an elongate base having a cross-section, a first leg projecting substantially normal to said base proximate a first end of said base and terminating at a first leg end distal of said base and a second leg projecting substantially normal to said base proximate a second end of said base and terminating at a second leg end distal of said base;
    (b) a bobbin affixed to said base of said first transformer core portion and including a portion substantially encircling said cross-section of said base;
    (c) a winding conductor including a portion wound on said bobbin and encircling said cross-section of said base;
    (d) a second magnetically permeable transformer core portion including a hinged connection with said first transformer core portion enabling relative rotation of said first transformer core portion relative to said second transformer core portion, relative rotation of said first transformer core portion and said second transformer core portion enabling conjoining of said first leg and said second leg with said second transformer core portion, said first and said second transformer core portions defining an aperture to substantially encircle said power cable when said first leg and said second leg are proximate said second transformer core portion, and relative rotation of said first transformer core portion and said second transformer core portion enabling separation of said second leg and said second transformer core portion to permit said power cable to be situated between the first and second legs of said first transformer core portion; and
    (e) a current switch conductively connected to said winding conductor and responsive to a voltage induced in said winding conductor by a current in said power cable to change a state of conductivity between a first signal terminal and a second signal terminal.

5. The device for monitoring current in a power cable of claim 4 wherein said bobbin comprises:
    (a) a tube having a first tube end and a second tube end, said tube substantially encircling said cross-section of said base of said first core portion;
    (b) a first flange extending outward from said tube proximate said first tube end; and
    (c) a second flange extending outward from said tube and spaced apart from said first flange, said winding conductor encircling said tube within said space between said first and said second flanges.

6. The device for monitoring current in a power cable of claim 4 further comprising a spring member elastically urging contact between said second transformer core portion and at least one of said first leg and said second leg of said first transformer core portion.

7. The device for monitoring current in a power cable of claim 4 further comprising a frame to which said first transformer core portion, said current switch, said first signal terminal and said second signal terminal are affixed.

8. A device for monitoring current in a power cable, said device comprising:
    (a) a first magnetically permeable transformer core portion comprising an elongate base having a cross-section, a first leg projecting substantially normal to said base proximate a first end of said base and terminating at a first leg end portion distal of said base and a second leg projecting substantially normal to said base proximate a second end of said base and terminating at a second leg end portion distal of said base;
    (b) a bobbin affixed to said base of said first transformer core portion and including a portion substantially encircling said cross-section of said base;
    (c) a winding conductor including a portion wound on said bobbin and encircling said cross-section of said base;
    (d) a current switch conductively connected to said winding conductor and responsive to a voltage induced in said winding conductor by a current in said power cable to change a state of conductivity between a first signal terminal and a second signal terminal;
    (e) a first housing portion to restrain said first transformer core portion and said current switch;
    (f) a second magnetically permeable transformer core portion;
    (g) a second housing portion to slidably restrain said second transformer core portion and including a hinge connecting said second housing portion to said first housing portion and enabling relative rotation of said first housing portion and said second housing portion, relative rotation of said first housing portion and said second housing portion conjoining of said first leg end portion and said second leg end portion with said second transformer core portion, said first and said second transformer core portions defining an aperture to encircle said power cable when said second leg end portion and said second transformer core portion are proximate, and relative rotation of said first housing portion and said second housing portion enabling separation of said second leg end portion and said second transformer core portion to enable said power cable to be situated between said first and said second legs of said first transformer core portion; and
    (h) a spring member elastically urging said second transformer core portion into contact with said first and said second leg end portions of said first transformer core portion.

9. The device for monitoring current in a power cable of claim 8 wherein said bobbin comprises:
    (a) a tube having a first tube end and a second tube end, said tube substantially encircling said cross-section of said base of said first core portion;
    (b) a first flange extending outward from said tube proximate said first tube end; and (c) a second flange extending outward from said tube and spaced apart from said first flange, said winding conductor encircling said tube within a space between said first and said second flanges.

10. The device for monitoring current in a power cable of claim 8 wherein said first signal terminal and said second signal terminal are restrained relative to said first transformer core section and said current switch by said first housing portion.

11. The device for monitoring current in a power cable of claim 8 further comprising a mounting base including a plurality of projecting arms slidable on a surface of said second housing portion, at least one of said projecting arm including a latching surface engageable with an engagement surface of said second housing to restrain relative movement of said mounting base and said second housing.

* * * * *